United States Patent [19]

Chung

[11] Patent Number: 5,352,622
[45] Date of Patent: Oct. 4, 1994

[54] STACKED CAPACITOR WITH A THIN FILM CERAMIC OXIDE LAYER

[75] Inventor: Henry W. Chung, Cupertino, Calif.

[73] Assignee: National Semiconductor Corporation, Santa Clara, Calif.

[21] Appl. No.: 116,222

[22] Filed: Sep. 2, 1993

Related U.S. Application Data

[62] Division of Ser. No. 865,337, Apr. 8, 1992, abandoned.

[51] Int. Cl.[5] .................................. H01L 21/70
[52] U.S. Cl. .............................. 437/52; 437/47; 437/60; 437/192; 437/919
[58] Field of Search ............... 257/306, 310; 437/47, 437/48, 52, 60, 192, 235, 238

[56] References Cited

U.S. PATENT DOCUMENTS

| | | | |
|---|---|---|---|
| 5,003,428 | 3/1991 | Shepherd | 361/321 |
| 5,045,899 | 9/1991 | Arimoto | 257/306 |
| 5,061,650 | 10/1991 | Denninson et al. | 437/60 |
| 5,229,309 | 7/1993 | Kato | 437/60 |
| 5,262,343 | 11/1993 | Rhodes et al. | 437/52 |
| 5,266,512 | 11/1993 | Kirsch | 437/52 |

FOREIGN PATENT DOCUMENTS

| | | |
|---|---|---|
| 222255 | 10/1986 | Japan . |
| 2238660 | 9/1990 | Japan .................. 257/306 |

Primary Examiner—Tom Thomas
Attorney, Agent, or Firm—Limbach & Limbach

[57] ABSTRACT

A self-aligned thin-film ceramic oxide stacked capacitor on an underlying semiconductor substrate using a spin-on ceramic oxide fabricated by forming conductive pillars and the lower electrode, forming a temporary layer, building up the semiconductor substrate around the temporary layer, removing the temporary layer, and then spinning on the ceramic oxide. This results in a ceramic oxide stacked capacitor with the conformal thin-film ceramic oxide encapsulated by the top electrode.

16 Claims, 7 Drawing Sheets

PLANAR CAPACITOR

TRENCH CAPACITOR

STACKED CAPACITOR

☐ ELECTRODE
▨ DIELECTRIC

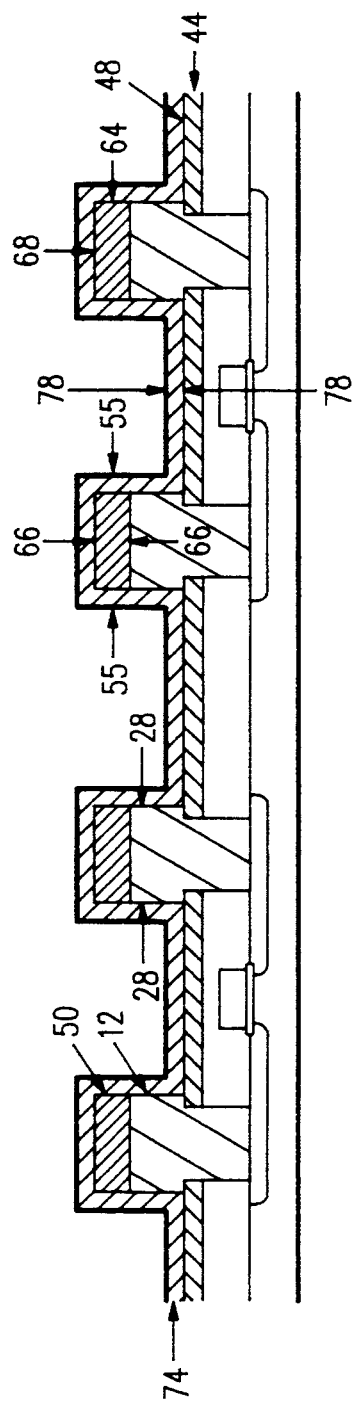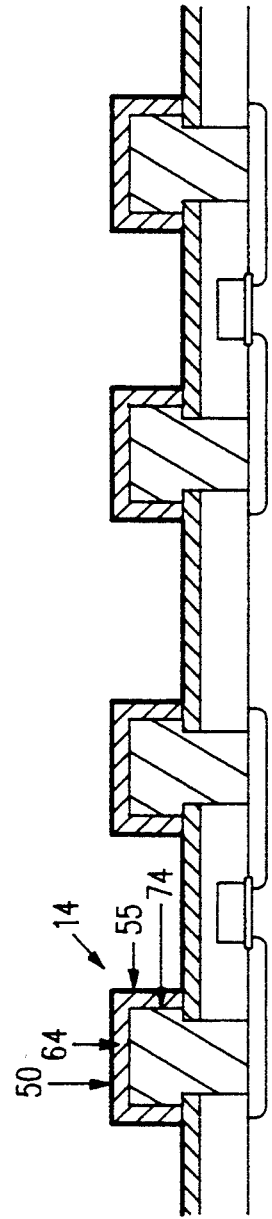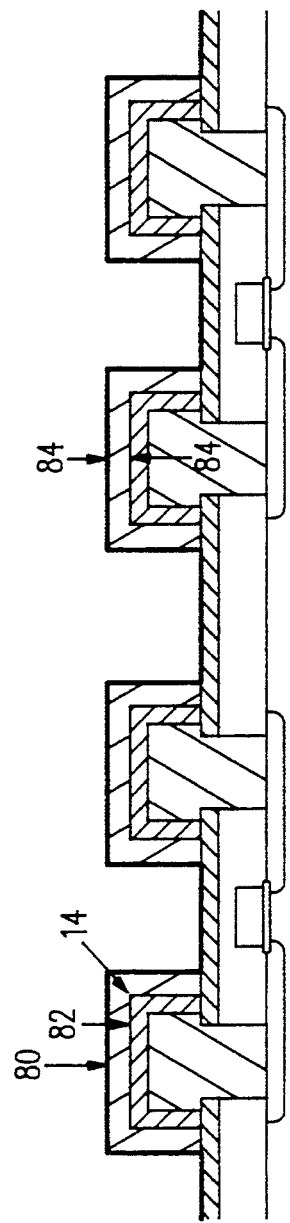
FIG. 3D
FIG. 3E
FIG. 3F

STACKED CAPACITOR WITH A THIN FILM CERAMIC OXIDE LAYER

This is a divisional application of application Ser. No. 07/865,337, filed on Apr. 8, 1992, now abandoned.

BACKGROUND OF THE INVENTION

1. Field of the Invention

The present invention relates to integrated circuit fabrication and, in particular, to fabrication of stacked capacitor structures utilizing thin film ceramic oxide.

2. Description of the Related Art

A. Electronic Ceramic Oxides

Electronics ceramic oxides have been used in electrical applications for many years as bulk ceramics due to their high dielectric constant. However, electronic ceramic oxides also display a spontaneous polarization characteristic which can be reversed upon the application of an electric field. Many new applications have been recently developed to take advantage of this polarization characteristic using thin film oxide ceramics (<1.0 μm). For example, thin film electronic ceramic oxides have been used for non-volatile memory applications, including EEPROM, EPROM, flash memory, magnetic core memory, plated wire memory, and SRAM and DRAM replacements. Other devices have also been developed which utilize thin film electronic ceramic oxides, such as surface acoustic wave (SAW) generators, electrooptic devices, fully integrated microsensors, microacuators, micromanipulators, and infrared detectors.

A variety of electronic ceramic oxides exist which can be used for thin film devices, including any of the over 400 ferroelectrics materials and high temperature superconductors. Of the ferroelectric class, common materials include lead titanate (PT), lead zirconate titanate (PZT), and lanthanum doped lead zirconate titanate (PLZT), along with the barium titanate family ($BaTiO_3$), lithium niobate ($LiNbO_3$), potassium niobate ($KNbO_3$), tungsten bronzes, lead magnesium niobate ($pbMgNbO_3$), and lead scandium niobate ($PbScNbO_3$). Typically, the properties of these materials are optimized through deposition technology and subsequent thermal heat treatments.

B. Stacked Capacitors

In solid-state integrated circuit technology, a major design goal is the reduction of the lateral size of the electrical elements comprising the integrated circuit so that more elements can be incorporated into the circuit without increasing its lateral size. One such integrated circuit element is a capacitor.

In reducing the lateral size of a capacitor structure, a primary objective is to maintain the total surface area of the capacitor, thereby maintaining its charge storage capability.

For example, in ferroelectric capacitor structures, which are used as charge storage devices in integrated circuits, maintaining a minimum charge storage capability is particularly important. In a ferroelectric capacitor, the non-volatile charge on the capacitor is used to define a particular memory state. When the total surface area of the capacitor becomes too small, the charge in the capacitor cannot properly be differentiated. This results in unpredictable memory states.

As shown in FIGS. 1A–1C, two semiconductor capacitor structures that have been developed to minimize the lateral use of silicon real estate consumed by the typical planar capacitor are the trench capacitor and the stacked capacitor. As the name implies, the first step in forming a trench capacitor is the formation of a trench in a semiconductor substrate. The bottom electrode is then conformally formed over the sidewalls and the bottom of the trench. Next, a dielectric layer is formed on the lower electrode and then the upper electrode is formed on the dielectric layer.

A stacked capacitor is formed by first creating an electrically conductive pillar that rises above the topography of the surface of the semiconductor substrate. The bottom electrode is then conformally formed over the pillar, followed by formation of a dielectric intermediate plate, and the top electrode.

Stacked capacitors have several advantages over trench capacitors. One primary advantage is that the fabrication of the stacked capacitor is a back-end technology whereas the fabrication of the trench capacitor is a front-end technology. In other words, stacked capacitors are formed during one of the later processing steps in the fabrication of a semiconductor circuit.

A back-end technology allows manufacturers the flexibility of standardizing the early processing steps so that several semiconductor circuits, having a particular front-end design like a MOS or bipolar, may be fabricated from common building blocks. Additionally, since stacked capacitors are formed above the surface topology of the semiconductor substrate, the stacked capacitor may be formed at a variety of locations. For example, stacked capacitors may be formed above the source, drain, and gate of a MOS transistor or above the collector, emitter, and base of a bipolar transistor.

An additional advantage of stacked capacitors over trench capacitors is that, as the technology is pushed to the limits, the trench capacitor must get narrower and deeper. As the trench capacitor gets narrower and deeper, it becomes more difficult to fill up the trenches. This problem is not encountered with the stacked capacitor approach. Even if technologies are developed to fill narrower and deeper trenches, the trench capacitor still consumes more lateral space than the stacked capacitor because the trench capacitor is placed next to a transistor structure whereas the stacked capacitor is placed above the transistor.

Ceramic oxide stacked capacitors in semiconductor integrated circuits, however, have proved to be difficult to fabricate. A stacked capacitor with a ceramic oxide layer is comprised of a conductive pillar, a bottom electrode, a thin-film ceramic oxide layer which is conformally formed over the outer surface of the bottom electrode, and a top electrode which covers the ceramic oxide layer.

After the conductive pillar and the bottom electrode have been formed, one method of forming the thin-film ceramic oxide layer is to spin on a ceramic oxide sol-gel. The difficulty, however, is that the spin-on ceramic oxide film, like all the other spin-on films, tends to planarize and fill up gaps. This makes it difficult to use spin-on films to obtain a uniform thickness of the ceramic oxide over the bottom electrode. Thus, it appears that a spin-on ceramic oxide film is incompatible with the stacked capacitor approach. Therefore, there is a need to provide a method for forming a conformal spin-on ceramic oxide layer on the surface of a bottom electrode.

Another problem with spin-on ceramic oxides is that the characteristics of the ceramic oxide degrade because of its interactions with silicon oxide and silicon nitride films which are commonly used as passivation layers. A passivation layer is a layer of material which is deposited over the entire top surface of the circuit to insulate and protect the circuit from mechanical and chemical damage. Silicon nitride is the preferred passivation material because it is compatible with inexpensive plastic packages. Since the ceramic oxide interacts with nitride, other passivation materials must be used which then require the use of a more expensive ceramic package. Thus, there is a need to have a ceramic oxide capacitor integrated circuit technology which is compatible with inexpensive plastic packaging techniques.

SUMMARY OF THE INVENTION

The present invention solves the above identified problems by providing a thin-film ceramic oxide stacked capacitor using spin-on ceramic oxide sol-gel formed on an underlying semiconductor substrate. First, an insulating layer is formed on the surface of the substrate. Openings are then formed in the layer of insulating material to expose a surface region of the substrate. A conductive pillar is then formed within the openings. The bottom surface of the pillar forms an electrical contact with the surface region and a top surface of the pillar extends above the top surface of the layer of insulating material. Next, a lower electrode is formed on the outer surface of the pillar. After the lower electrode has been formed, a temporary layer is formed, then a second temporary layer is built up around the first temporary layer, and then the first temporary layer is removed, forming a self-aligned trench between the lower electrode and the second temporary layer. A thin-film ceramic oxide layer is then spun on the surface of the lower electrode and the second temporary layer. Next, the thin-film ceramic oxide layer is etched until the second temporary layer is exposed. Following this, the second temporary layer is removed, forming a thin-film ceramic oxide layer which conformally coats the lower electrode. After the crystallization of the ceramic oxide layer, an upper electrode is formed on the surface of the thin-film ceramic oxide layer so that the upper electrode encapsulates the thin-film layer of ceramic oxide material.

Other features and advantages of the present invention will become apparent and be appreciated by referring to the following detailed description of the invention which should be considered in conjunction with the accompanying drawings.

DETAILED DESCRIPTION

Figure 1A:
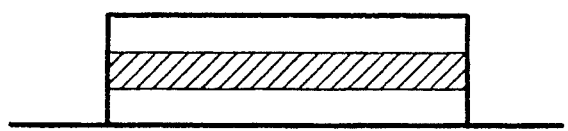
FIGS. 1A-1C show the difference between a stacked capacitor and a trench capacitor.
Figure 1B:
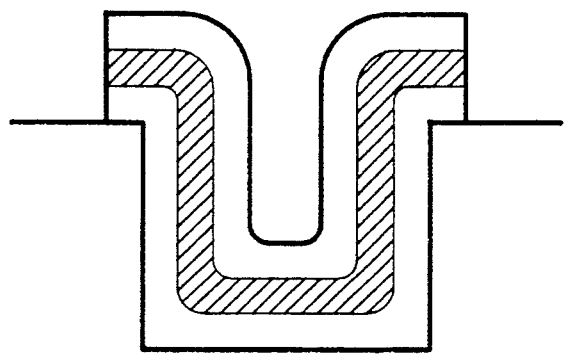
Figure 1C:
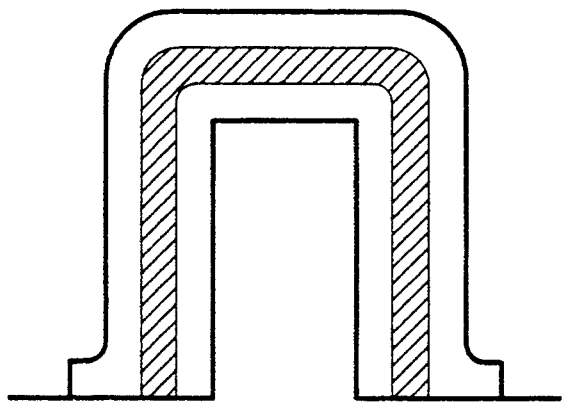
Figure 2:
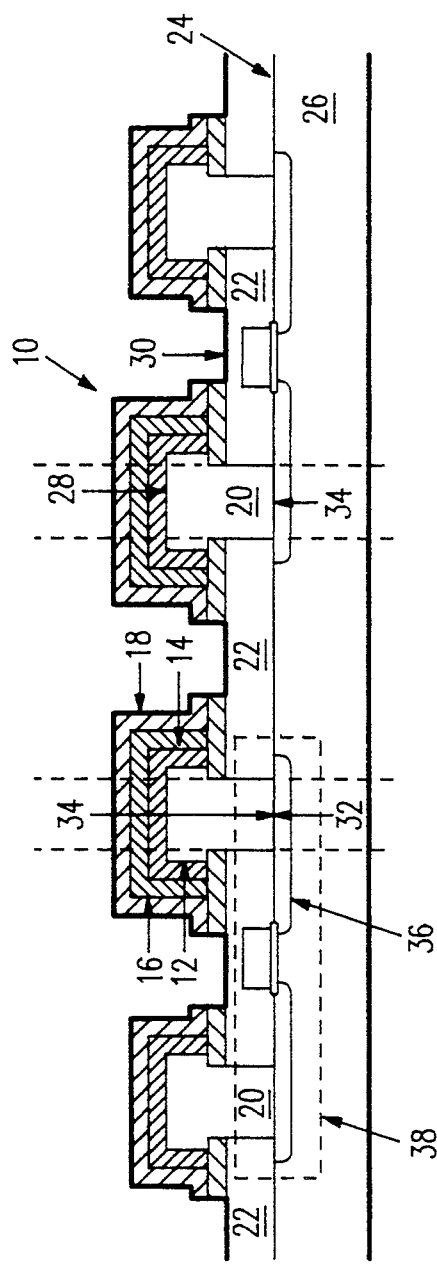
FIG. 2 shows a thin-film ceramic oxide stacked capacitor.

As shown in FIG. 2, a ceramic oxide stacked capacitor 10, in accordance with the preferred embodiment of the present invention, comprises an electrically conductive pillar 12, a lower electrode 14, a thin-film layer of ceramic oxide material 16, and an upper electrode 18. The pillar 12 is formed in an opening 20 of a layer of insulating material 22. The layer of insulating material 22 is formed on a surface 24 of a semiconductor substrate 26. An upper surface 28 of the pillar 12 extends above a top surface 30 of the layer of insulating material 22. A bottom surface 32 of the pillar 12 forms an electrical contact with a surface region 34 of the semiconductor substrate 26.

In the preferred embodiment of the present invention, the surface region 34 of the substrate 26 is a source region 36 of a NMOS transistor 38. It should be understood by those skilled in the art that the surface region 34 may comprise any single electrically conductive region, such as the source, drain, or gate of a MOS transistor or the collector, base, emitter of a bipolar transistor.

Figure 3A:
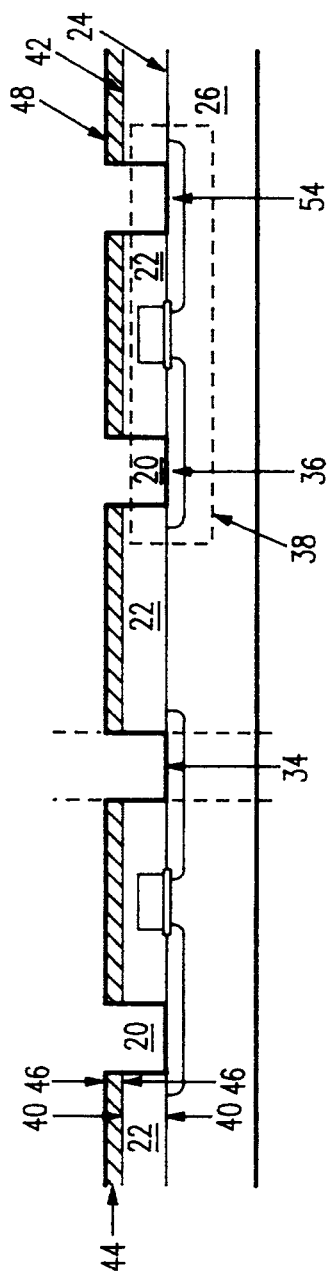
FIGS. 3A-3N and 3P show the steps in fabricating a thin-film ceramic oxide stacked capacitor.

Referring to FIG. 3A, the stacked ceramic oxide capacitor 10 is fabricated by first depositing the layer of insulating material 22 over the surface 24 of the substrate 26 to a uniform depth 40 of approximately 2,000–20,000 Angstroms. In the preferred embodiment, the layer of insulating material 22 comprises silicon dioxide, phosphosilicate glass, or boro-phosphosilicate glass. On a surface 42 of the layer of insulating material 22, a layer of silicon nitride (not shown in FIG. 3A) is then formed as a protective material to a thickness of approximately 200–9,000 Angstroms. On a surface (not shown in FIG. 3A) of the layer of silicon nitride, a layer of titanium oxide 44 is then formed to a thickness 46 of approximately 200–5,000 Angstroms. The layers of silicon nitride and titanium oxide are used to prevent direct contact between the insulating material 22 and a ceramic oxide material which will be deposited in a subsequent step.

The opening 20 is then formed in the layer of titanium oxide 44, silicon nitride, and insulating material 22 to expose the surface region 34 of the substrate 26. In the preferred embodiment, the substrate 26 contains the NMOS transistor 38 which has been previously formed by well-known conventional integrated circuit fabrication techniques. Region 36 is the source region and region 54 is the drain region of the NMOS transistor 38.

After the layer of titanium oxide 44 has been deposited, a photoresist pattern (not shown in FIG. 3A), which defines the opening 20, is then formed on a surface 48 of the layer of titanium oxide 44 by conventional photoresist formation, photolithographic exposure, development and removal techniques. The layer of titanium oxide 44 is then etched utilizing a fluorine or chlorine-based etching chemistry until the surface of the layer of silicon nitride is reached.

Following this, the layer of silicon nitride and the layer of insulating material 22 are etched utilizing a fluorine-based etching chemistry until the surface region 34 of the substrate 26 is exposed.

Figure 3B:
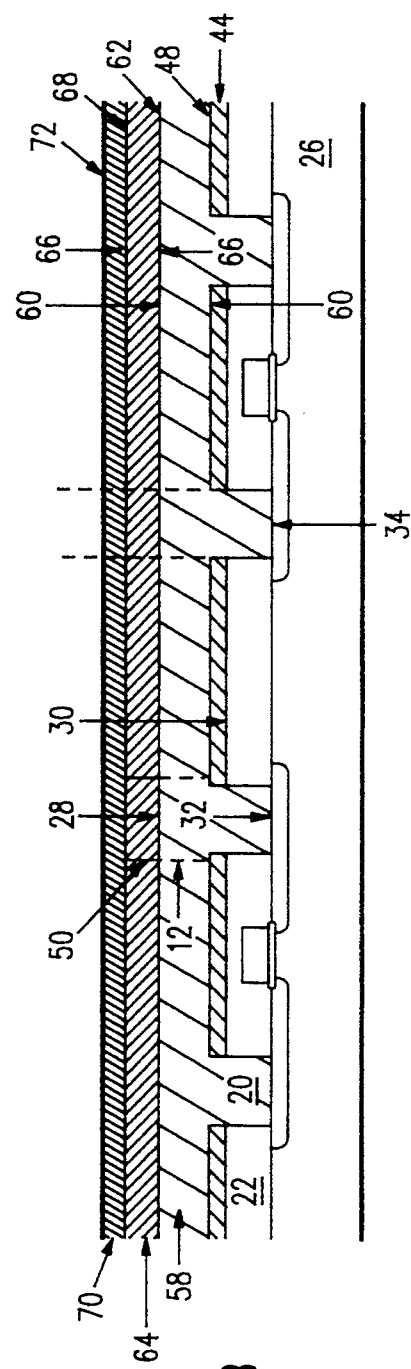

Referring to FIG. 3B, after the opening 20 has been formed, the pillar 12 and a top portion 50 of the lower electrode 14 shown in FIG. 2 are formed so that the surface 28 of the pillar 12 extends above the top surface 30 of the layer of insulating material 22 and so that the bottom surface 32 of the pillar 12 forms an electrical contact with the surface region 34 of the semiconductor substrate 26.

The pillar 12 and the top portion 50 of the lower electrode 14 shown in FIG. 2 are formed by depositing a first layer of tungsten 58. The first layer of tungsten 58 is formed as an electrically conductive layer to a uniform depth 60 of approximately 2,000–20,000 Angstroms on the surface 48 of the layer of titanium oxide 44 so that the first layer of tungsten 58 fills up the opening 20.

In the preferred embodiment, the first layer of tungsten 58 is formed by chemically vapor deposition (CVD) techniques. When tungsten is chemically vapor deposited, a thin adhesion layer of conductive film is usually deposited to promote the adhesion of the tungsten to the silicon oxide, silicon nitride and titanium oxide. The adhesion layer can be titanium, titanium nitride, titanium-tungsten, or sputter-deposited tungsten. Before the deposition of the adhesion layer, a layer of titanium silicide or cobalt silicide may be formed at the surface region 34 of the semiconductor substrate 26 to reduce the contact resistance between the first layer of tungsten 58 and the surface region 34.

Over the surface 62 of the first layer of tungsten 58, a first layer of ruthenium 64 is then deposited as a second conductive layer to a uniform depth 66 of approximately 100–5,000 Angstroms. The ruthenium may then be oxidized to form a ruthenium oxide film. This film may be necessary as a barrier to prevent excessive interactions between the first layer of tungsten 58 and a subsequent layer of ceramic oxide when a subsequent sintering step of the ceramic oxide is performed.

Over the surface 68 of the layer of ruthenium 64, a first layer of titanium 70 is then deposited as a hard mask to a thickness of approximately 100–5,000 Angstroms. After the first layer of titanium 70 has been deposited, a photoresist pattern (not shown in FIG. 3B), which defines the pillar 12, is then formed on the surface 72 of the first layer of titanium 70 by conventional photoresist formation, photolithographic exposure, development, and removal techniques. The first layer of titanium 70 forming the pillar 12 is then etched with a fluorine or chlorine-based etching chemistry until the first layer ruthenium 64 is exposed. The photoresist is then removed with oxygen plasma or organic solvents.

Figure 3C:
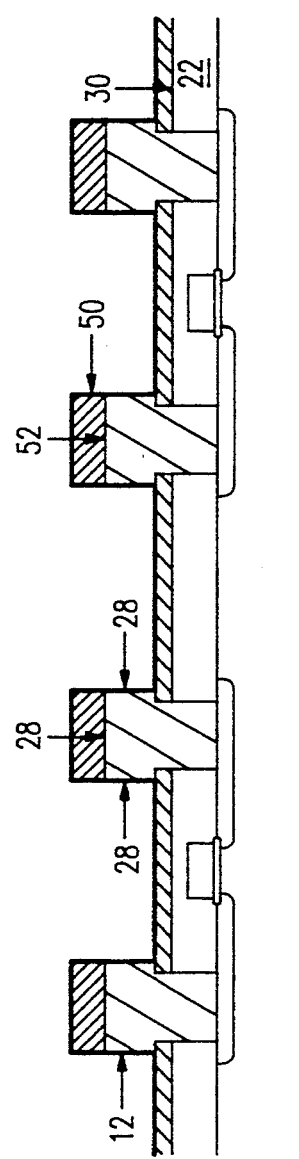

Following this, the first layer of ruthenium 64 forming the pillar 12 is then etched with sputter etch or ion milling until the first layer of tungsten 58 is exposed. The first layer of tungsten 58 is then etched utilizing a fluorine or chlorine-based etching chemistry until the layer of titanium oxide 44 is exposed. The first layer of ruthenium 64 is used as a hard mask for etching the first layer of tungsten 58. After the layer of titanium oxide 44 has been exposed, the first layer of titanium 70 is then removed. As shown in FIG. 3C, at the completion of this step, the pillar 12 has been formed so that the surface 28 of the pillar 12 extends above the top surface 30 of the layer of insulating material 22. In addition, the top portion 50 of the lower electrode 14 shown in FIG. 2 has been formed on the top surface 52 of the pillar 12.

Referring to FIG. 3D, after the pillar 12 and the portion 50 of the lower electrode 14 shown in FIG. 2 have been formed, a side portion 55 of the lower electrode 14 shown in FIG. 2 is then formed on the exposed surface 28 of the pillar 12. The side portion 55 of the lower electrode 14 shown in FIG. 2 is formed by depositing a second layer of ruthenium 74 as an electrically conductive material on the exposed surface 28 of the pillar 12, the surface 68 of the first layer of ruthenium 64, and the surface 48 of the layer of titanium oxide 44 to a depth 78 of approximately 100–5,000 Angstroms. In the preferred embodiment, the second layer of ruthenium 74 is used so that the lower electrode 14 shown in FIG. 2, comprising two separate layers of electrically conductive material, 64 and 74, will be formed from the same material.

After the second layer of ruthenium 74 has been deposited, the second layer of ruthenium 74 is then anisotropically etched with sputter etch or ion milling until the second layer of ruthenium 74 has been removed from the surface 48 of the layer of titanium oxide 44. Due to the anisotropic nature of the etch process, the portion of the layer of ruthenium 74 on the sidewall of the pillar 55 is not removed. In the preferred embodiment, the thickness 78 of the second layer of ruthenium 74 is less than the depth 66 of the first layer of ruthenium 64 to insure that the surface 52 of the pillar 12 is covered with the first layer of ruthenium 64 after the etching steps have been completed. As shown in FIG. 3E, after the last etching step has been completed, the lower electrode 14 has been formed with a top portion 50 comprised of the first layer of ruthenium 64 and a side portion 55 comprised of the second layer of ruthenium 74.

Referring to FIG. 2, after the lower electrode 14 has been formed, the thin-film layer of ceramic oxide 16 is formed on the lower electrode 14. Referring to FIG. 3F, the thin-film layer of ceramic oxide is formed by first depositing a second layer of tungsten 80 as a temporary layer on the surface 82 of the lower electrode 14. This second layer of tungsten 80 is deposited by a selective chemical vapor deposition technique. As a result, the second layer of tungsten 80 is deposited on the surface 82 of the lower electrode 14; there is no tungsten deposited on the layer of titanium oxide 44. The second layer of tungsten 80 is conformally deposited to a thickness 84 of 200–9,000 Angstroms. The thickness 84 of the second layer of tungsten 80 is equivalent to the desired thickness of the thin-film layer of ceramic oxide material prior to sintering.

Figure 3G:
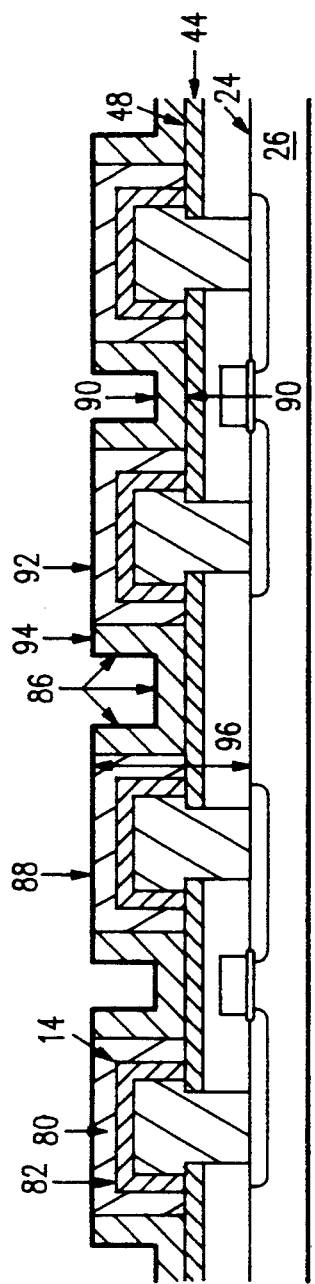

Referring to FIG. 3G, after the second layer of tungsten 80 has been formed on the surface 82 of the lower electrode 14, a temporary layer of silicon oxide 86 is then formed on the surface 88 of the second layer of tungsten 80 and the surface 48 of the layer of titanium oxide 44. (The portion of silicon oxide which covers the top surface 88 of the second layer of tungsten 80 is not shown.) Subsequently, the second layer of tungsten 80 will be removed and the layer of silicon oxide 86 will be used to form a mold for the definition of the ceramic oxide layer.

The layer of silicon oxide 86 is formed to a depth 90 on the surface 48 of the layer of titanium oxide 44. Next, the layer of silicon oxide 86 is etched, with an etching chemistry which is highly selective to the second layer of tungsten 80, by an etching chemistry mainly comprising $CHF_3$ until the surface 88 of the second layer of tungsten 80 is exposed. The removal of the top portion of silicon oxide 86 can also be achieved by using mechanical/chemical polishing techniques. As shown in FIG. 3G, etching until the second layer of tungsten 80 is exposed results in a top surface 92 of the second layer of tungsten 80 and a top surface 94 of the layer of silicon oxide 86 having substantially the same height 96 above the surface 24 of the substrate 26.

The processing latitude in removing the top portion of silicon oxide 86 can be increased if the top surface 94 of the layer of silicon oxide 86 is made fairly planar or the trenches 87 are filled up with certain materials. This can be achieved by several means. By optimizing the deposition conditions of the layer of silicon oxide 86, the top surface 94 of the layer of silicon oxide 86 can be made planar or, at least, the size and the depth of the trench 87 can be reduced. In a different approach, photoresist or spin-on glass (SOG) is spun on the wafer to fill the trenches 87. When the latter approach is taken, photoresist or spin-on glass is selectively removed after the completion of the removal of the layer of silicon oxide 86, on the top of the lower electrode 14.

Figure 3H:
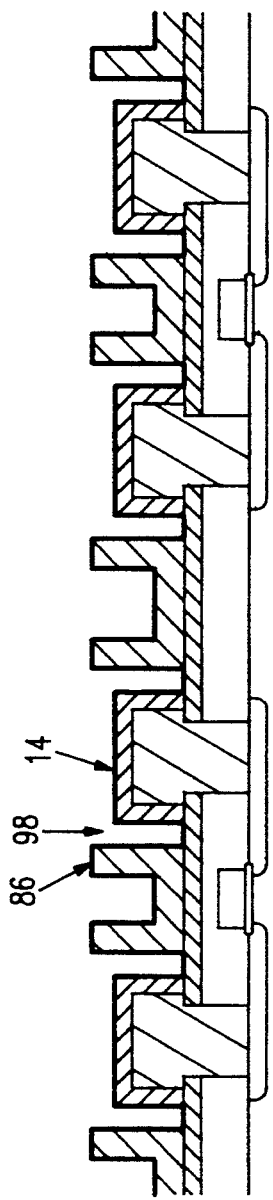

Next, the second layer of tungsten 80 is etched with an etching chemistry which is highly selective to the layer of silicon oxide 86, the lower electrode 14, and the layer of titanium oxide 44 until the second layer of tungsten 80 has been removed. In the preferred embodiment the etching chemistry comprises a mixture of $H_2O_2$ and $NH_4OH$. As shown in FIG. 3H, the layer of silicon oxide 86 is used as a structure so that when the second layer of tungsten 80 is removed, a trench 98 is formed between the lower electrode 14 and the layer of silicon oxide 86.

Figure 3I:
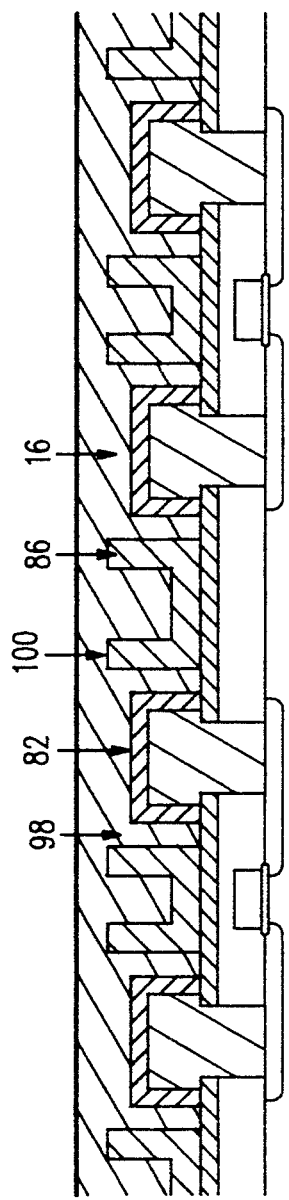

Referring to FIG. 3I, after the second layer of tungsten 80 has been removed, a thin-film layer of ceramic oxide 16 is then spun onto the surface 82 of the lower electrode 14 and the surface 100 of the layer of silicon oxide 86 so that the thin-film layer of ceramic oxide 16 fills up the trench 98. By forming the trench 98, the thin-film layer of ceramic oxide 16 is self-aligned to the lower electrode 14. In the preferred embodiment, the ceramic oxide material 16 is a ferroelectric material. The thin-film layer of ceramic oxide 16 can also be deposited by other techniques. The thin-film layer of ceramic oxide 16 can be deposited using metallo-organic chemical vapor deposition (MOCVD). It can also be deposited by sputter deposition and laser ablation. If the trenches 98 are not filled, a localized laser melting can be used to flow the thin-film layer of ceramic oxide 16 and fill the trenches 98.

Figure 3J:
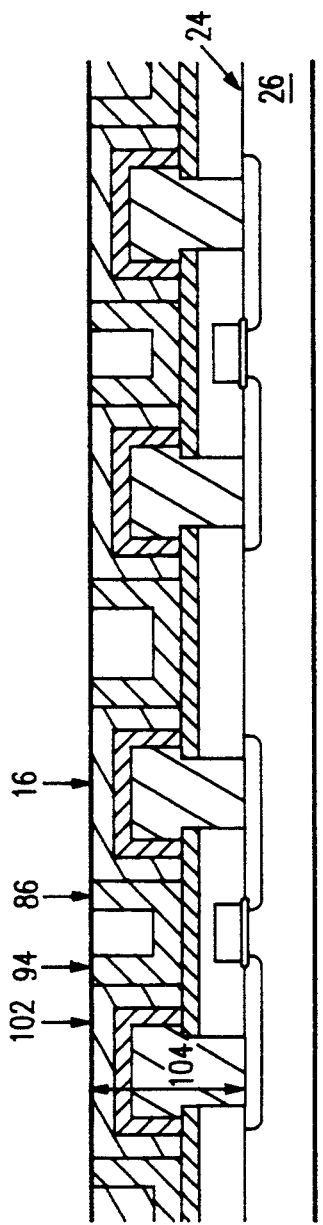

Referring to FIG. 3J, the thin-film layer of ceramic oxide 16 is then etched with an etching chemistry, which is highly selective to the layer of silicon oxide 86, until the top surface 94 of the layer of silicon oxide 86 is exposed. As shown in FIG. 3J, etching until the layer of silicon oxide 86 is exposed results in the top surface 94 of the layer of silicon oxide 86 and the top surface 102 of the thin-film layer of ceramic oxide 16 having substantially the same height 104 above the surface 24 of the substrate 26. Alternately, the thin-film layer of ceramic oxide 16 can be removed by other means such as chemical/mechanical polishing.

Figure 3K:
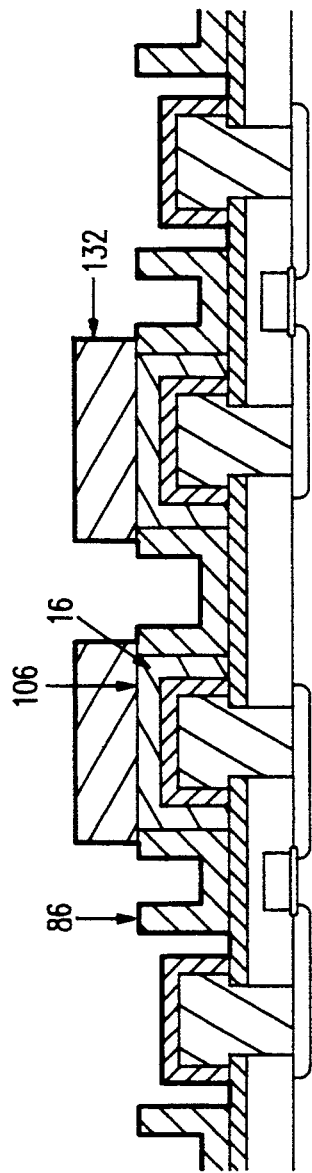

Referring to FIG. 3K, over the surface 106 of the thin-film layer of ceramic oxide 16, a photoresist pattern 132 which defines the thin-film layer of ceramic oxide 16, is then formed by conventional photolithographic photoresist formation, exposure, development, and removal techniques. Next, the thin-film layer of ceramic oxide 16 not covered by the photoresist pattern 132 is etched with an etching chemistry comprising aqueous hydrogen fluoride until the thin-film layer of ceramic oxide 16 uncovered by the photoresist pattern 132 is removed.

Figure 3L:
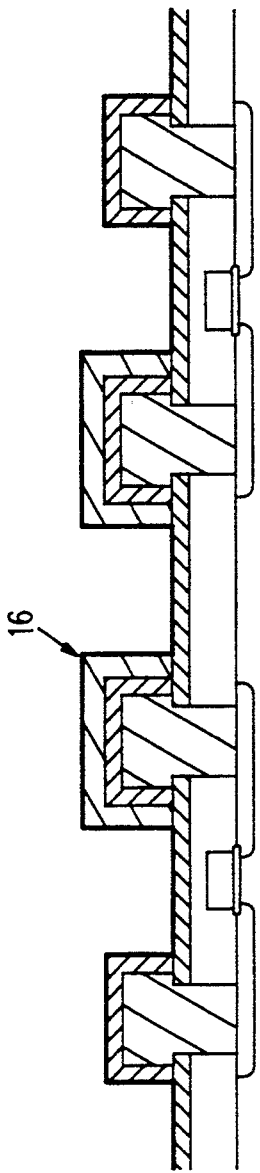

Following this, the layer of silicon oxide 86 is then removed with a selective etch such as an isotropic plasma etch. As shown in FIG. 3L, the thin-film layer of ceramic oxide 16 is fully exposed after the layer of silicon oxide 86 is removed. As stated above, in the preferred embodiment, the layer of ceramic oxide is PLZT. The PLZT is then crystallized by sintering. The PLZT will shrink during sintering.

Figure 3M:
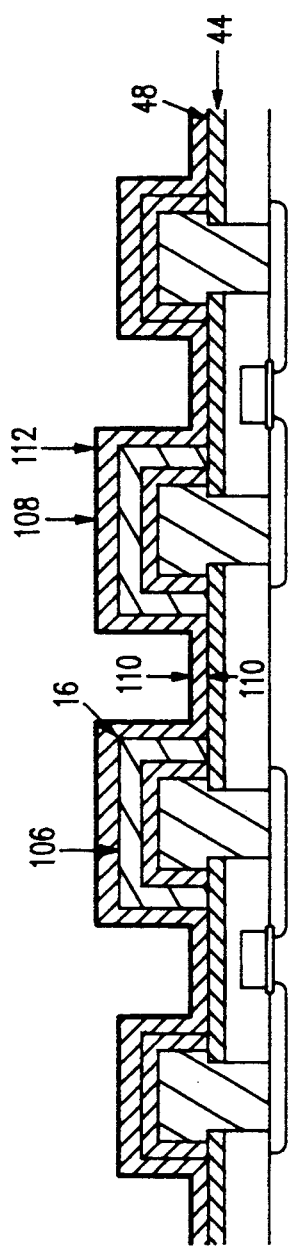

Referring to FIG. 2, after the thin-film layer of ceramic oxide 16 has been formed, an upper electrode 18 is then formed on the thin-film layer of ceramic oxide 16. Referring to FIG. 3M, the upper electrode 18 is formed by first depositing a third layer of ruthenium 108 as an electrically conductive layer to a substantially uniform depth 110 of approximately 100–5,000 Angstroms on the surface 106 of the thin-film layer of ceramic oxide 16 and the surface 48 of the layer of titanium oxide 44. By forming the upper electrode 18 over the thin-film layer of ceramic oxide 16, the upper electrode 18 is self-aligned to the lower electrode 14. Next, a second layer of titanium (not shown in FIG. 3M) is deposited as a hard mask to a substantially uniform thickness of approximately 100–5,000 Angstroms over the surface 112 of the third layer of ruthenium 108.

Over the surface of the second layer of titanium, a photoresist pattern (not shown in FIG. 3M), which defines the upper electrode 18, is then formed by conventional photoresist formation, photolithographic exposure, development, and removal techniques. The second layer of titanium corresponding to the photoresist pattern is etched with a fluorine or chlorine-based etching chemistry until the second layer of titanium corresponding to the photoresist pattern is removed.

Figure 3N:
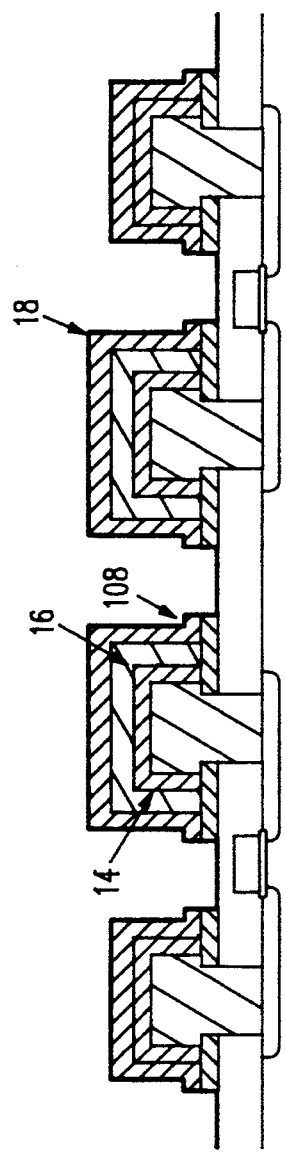

After the second layer of titanium has been etched and the photoresist is subsequently removed, the third layer of ruthenium 108 is anisotropically etched with sputter etch or ion milling until the surface 48 of the layer of titanium oxide 44 is exposed. Using the third layer of ruthenium 108 as a hard mask, the exposed titanium oxide and the underlying silicon nitride is then anisotropically removed in a chlorine-based chemistry until the layer of insulating material 22 is exposed. As shown in FIG. 3N, after the previous etching step has been completed, the upper electrode 18 has been formed. In addition, since the third layer of ruthenium 108 is anisotropically etched, the third layer of ruthenium 108 completely encapsulates the thin-film layer of ceramic oxide 16. A thermal anneal can then be performed to optimize the interface between the layers of ruthenium, 64, 74, shown in FIG. 3M, and 108, and the layer of ceramic oxide 16.

Figure 3P:
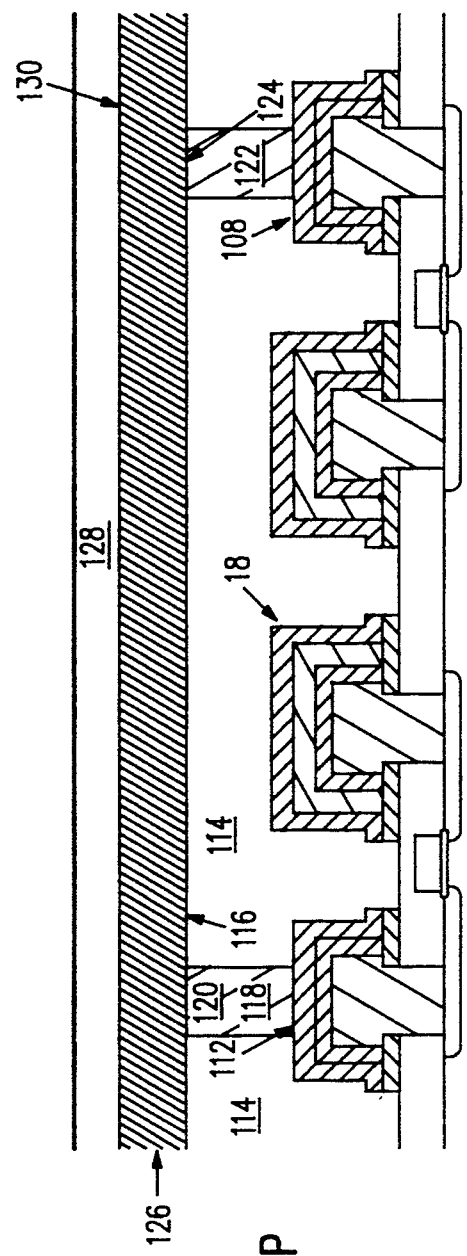

Referring to FIG. 3P, after the upper electrode 18 has been formed, a layer of dielectric material 114 is then deposited and planarized. Over the surface 116 of the layer of dielectric material 114, a photoresist pattern (not shown in FIG. 3P), which defines a metal contact opening 118, is then formed by conventional photoresist formation, photolithographic exposure, development, and removal techniques. The layer of dielectric material 114 corresponding to the photoresist pattern is etched with a fluorine-based etching chemistry until the surface 112 of the third layer of ruthenium 108 is exposed. The metal contact opening 118 forms a hole 120.

Following this, a third layer of tungsten 122 is then deposited as an electrically conductive layer so that the hole 120 is filled up.

Over the surface 124 of the third layer of tungsten 122, a photoresist pattern (not shown in FIG. 3P), which defines the metal contact 118, is then formed by conventional photoresist formation, photolithographic exposure, development, and removal techniques. The third layer of tungsten 122 corresponding to the photoresist pattern is etched utilizing a fluorine or chlorine-based etching chemistry until the surface 116 of the layer of dielectric material 114 is detected.

Following this, a layer of aluminum 126 is then deposited as an electrically conductive layer on the surface 124 of the third layer of tungsten 122 and the surface 116 of the layer of dielectric material 114. Following this, an aluminum conductive path (not shown in FIG. 3P) is formed from the layer of aluminum 126 by conventional means. Next, a layer of silicon oxide and a layer of silicon nitride 128 is deposited as a passivation layer on the surface 130 of the layer of aluminum 126.

Producing the stacked ceramic oxide capacitor 10, shown in FIG. 2, in accordance with the above described steps has several advantages. First, the stacked ceramic oxide capacitor 10 utilizes less silicon real estate to provide the equivalent charge storage capacity of a planar capacitor. In a stacked capacitor, the height of the pillar 12 is the predominant factor in increasing the capacitor size.

Second, only two extra masking steps are required to form the stacked ceramic oxide capacitor 10 because the thin-film layer of ceramic oxide 16 and the upper electrode 18 are self-aligned to the lower electrode 14.

Third, the thickness of the thin-film layer of ceramic oxide 16 is determined by the thickness 84 of the layer of tungsten 80 shown in FIG. 3F. Since this is a thin-film approach which can be accurately controlled, the thickness of the thin-film layer of ceramic oxide 16 is not limited by any photolithographic limitations or the planarity of spin-on ceramic oxides.

Fourth, the limitations imposed by the planarity of spin-on ceramic oxides are removed; thus, the advantages of ceramic oxide sol-gel can be fully exploited.

Fifth, since the thin-film layer of ceramic oxide 16 is fully encapsulated by the upper electrode 18, the upper electrode 18 prevents the thin-film layer of ceramic oxide 16 from interacting with other materials, specifically the silicon oxide and silicon nitride passivation layer. Thus, the passivation layer 128, may be formed from nitride. The use of a silicon nitride passivation layer allows the use of a plastic package rather than the more expensive ceramic package which must be used if a silicon nitride passivation layer degrades the performance of ceramic oxide capacitors.

The materials used in this description are for the purpose of illustration. Alternative materials which are compatible with the different requirements can also be used.

There are a variety of electrical ceramic oxides suitable for use in the above-described structures (lead titanate, $PbTiO_3$; lead zirconate titanate, "PZT"; lanthanum doped PZT, "PLZT"; and barium titanate, $BaTiO_3$). Electrical ceramic oxides are also used in electro-optical devices ("PLZT"; lithium niobate, $LiNbO_3$; and bismuth titanate, $Bi_4Ti_3O_{12}$) and high temperature superconductors (yttrium barium copper oxide, $VBa_2Cu_3O_7$). The properties of these electrical ceramic oxides are typically optimized by heat treatments in oxidizing ambients at high temperatures (for example, 500° C. to 1100° C.). Many common materials are not suitable for use under such conditions. For example, aluminum melts or reacts with the electrical ceramic oxide material, while tungsten and molybdenum are destructively oxidized. Silicides and polysilicon either react with the electrical ceramic oxides at high temperature or are oxidized at the surface in contact with the electrical ceramic oxide. Silicon dioxide and silicon nitride may also react at these higher temperatures.

In the preferred embodiment, the layers of silicon nitride and titanium oxide 44 were used as a barrier to prevent the ceramic oxide capacitor material from interacting with the layer of insulating material 22. Alternatively, other dielectric films which prevent interaction can also be used.

In the preferred embodiment, a chemically vapor deposited layer of tungsten 58 was used to form the pillar 12. Alternatively, the pillar 12 can also be formed from a layer of amorphous or polycrystalline silicon which has been doped to be conductive.

In the preferred embodiment, a first layer of titanium 70 and a second layer of titanium (not shown in FIG. 3M) were used as hard masks to define the lower electrode 14 and the upper electrode 18. Alternatively, a sputter-deposited layer of tungsten can also be used. In the preferred embodiment, the layers of ruthenium 64, 74 and 108, can be replaced with layers of ruthenium oxide.

It should be understood that various alternatives to the structures described herein may be employed in practicing the present invention. It is intended that the following claims define the invention and that structures within the scope of these claims and their equivalents be covered thereby.

What is claimed is:

1. A method of fabricating a thin-film ceramic oxide stacked capacitor on an underlying semiconductor substrate, the method comprising the steps of:

forming a layer of insulating material on the semiconductor substrate;

forming an opening in the layer of insulating material to expose a surface region of the semiconductor substrate;

forming a pillar of an electrically conductive material within the opening such that a bottom surface of the pillar is in electrical contact with the surface region of the semiconductor substrate and an exposed sidewall surface of the pillar extends above a top surface of the layer of insulating material, the pillar having a top portion of a lower electrode formed thereon;

forming a side portion of the lower electrode on the exposed sidewall surface of the pillar;

forming a temporary layer on a surface of the lower electrode;

forming a layer of molding material around the temporary layer;

removing the temporary layer so that an insulating mold is formed for a subsequent thin-film layer of ceramic oxide;

forming the thin-film layer of ceramic oxide on the lower electrode and in the mold;

forming an upper electrode on the thin-film layer of ceramic oxide, whereby the upper electrode functions as one plate of the thin-film ceramic oxide stacked capacitor, the thin-film layer of ceramic oxide functions as a dielectric, and the lower electrode functions as the other plate of the thin-film ceramic oxide stacked capacitor.

2. The method of claim 1 wherein the insulating material comprises silicon oxide.

3. The method of claim 2 wherein the molding material comprises silicon oxide.

4. The method of claim 3 wherein the electrically conductive material comprises tungsten.

5. The method of claim 4 wherein the ceramic oxide material comprises PLZT.

6. A method of fabricating a thin-film ceramic oxide stacked capacitor on an underlying semiconductor substrate, the method comprising the steps of:

forming a layer of insulating material on a surface of the substrate;

forming an opening in the layer of insulating material to expose a surface region of the substrate;

depositing a first layer of electrically conductive material over a surface of the layer of insulating material so that the first layer of electrically conductive material fills the opening in the layer of insulating material;

depositing a second layer of electrically conductive material on the first layer of electrically conductive material;

etching the first and second layers of electrically conductive material to form an electrically conductive pillar so that a bottom surface of the pillar is in electrical contact with the surface region of the substrate and an exposed sidewall surface of the pillar extends above a top surface of the layer of insulating material, the pillar having a top portion of a lower electrode formed thereon;

depositing a third layer of electrically conductive material on the exposed sidewall surface of the electrically conductive pillar, the top portion of the lower electrode, and the layer of insulating material;

etching the third layer of electrically conductive material to form the lower electrode;

forming a layer of temporary material on a surface of the lower electrode;

forming a layer of an insulating molding material on a surface of the layer of temporary material and the layer of insulating material;

etching the layer of temporary material until the layer of temporary material is completely removed so that a trench is formed between the lower electrode and the layer of molding material;

forming a layer of ceramic oxide on a surface of the lower electrode and a surface of the layer of molding material so that the layer of ceramic oxide fills the trench created by the removal of the layer of temporary material;

removing the layer of molding material to form a thin-film layer of ceramic oxide having a substantially uniform thickness over the surface of the lower electrode and in the mold;

depositing a fourth layer of electrically conductive material on a surface of the thin-film layer of ceramic oxide and the layer of insulating material; and etching the fourth layer of electrically conductive material to form the upper electrode so that the fourth layer of electrically conductive material encapsulates the thin-film layer of ceramic oxide.

7. The method of claim 6 wherein the insulating material comprises silicon oxide.

8. The process of claim 7 wherein the first layer of electrically conductive material comprises tungsten.

9. The process of claim 8 wherein the second layer of electrically conductive material comprises ruthenium.

10. The process of claim 9 wherein the third layer of electrically conductive material comprises ruthenium.

11. The method of claim 10 wherein the molding material comprises silicon oxide.

12. The process of claim 11 wherein the fourth layer of electrically conductive material comprises ruthenium.

13. The process of claim 12 wherein the layer of insulating material comprises silicon oxide.

14. The process of claim 13 wherein the layer of ceramic oxide comprises PLZT.

15. The process of claim 14 wherein the layer of first material comprises tungsten.

16. The process of claim 15 wherein the layer of second material comprises silicon oxide.

* * * * *